United States Patent [19]
Siebert et al.

[11] Patent Number: 5,897,705
[45] Date of Patent: Apr. 27, 1999

[54] PROCESS FOR THE PRODUCTION OF AN EPITAXIALLY COATED SEMICONDUCTOR WAFER

[75] Inventors: Wolfgang Siebert, Kastl; Erwin-Peter Mayer, Burghausen, both of Germany

[73] Assignee: Wacker Siltronic Gesellschaft für Halbeitermaterialien mbH, Burghausen, Germany

[21] Appl. No.: 08/630,883

[22] Filed: Apr. 2, 1996

[30] Foreign Application Priority Data

Jun. 1, 1995 [DE] Germany .............. 195 20 175

[51] Int. Cl.$^6$ .................................. C30B 13/10
[52] U.S. Cl. ................ 117/49; 117/97; 117/933; 117/935
[58] Field of Search ................ 117/49, 97, 933, 117/935

[56] References Cited

U.S. PATENT DOCUMENTS

| | | | |
|---|---|---|---|
| 5,059,401 | 10/1991 | Watanabe et al. | 117/933 |
| 5,089,082 | 2/1992 | Dreier et al. . | |
| 5,189,508 | 2/1993 | Tachimori et al. . | |
| 5,211,802 | 5/1993 | Kaneko et al. | 117/933 |
| 5,355,831 | 10/1994 | Schauer . | |

FOREIGN PATENT DOCUMENTS

| | | |
|---|---|---|
| 0054657 | 6/1982 | European Pat. Off. . |
| 0504929 | 9/1992 | European Pat. Off. . |
| 0644588 | 3/1995 | European Pat. Off. . |
| 1399130 | 4/1965 | France . |
| 3910185 | 10/1989 | Germany . |
| 4119531 | 12/1992 | Germany . |
| 4331894 | 3/1994 | Germany . |

OTHER PUBLICATIONS

Patent Abstracts of Japan, vol. 11, No. 27 (E–474), Jan. 27, 1987 & JP–A–61 198638 (Sony Corp.) "Semiconductor Device".
Derwent Abstract For DE 4119531.
Derwent Abstract For EP 0054657.
S.M. Hu, Appl. Phys. Lett. vol. 31, No. 2, Jul. 1977, 53–55 "Dislocation Pinning Effect of Oxygen Atoms in Silicon".
W. Dietze et al., Crystals, Growth, Properties and Applications, vol. 5, Springer–Verlag 1981, pp. 1–42.
Hiroshi Hirata and Naoshi Inoue, Japanese Journal of Applied Phys. vol. 24, No. 11, Nov. 1985, pp. 1399–1403 "Macroscopic Axial Dopant Distribution in Czochralski Silicon Crystals Grown in a Vertical Magnetic Field".
English Derwent Abstract for DE 4331894 "Semiconductor Substrate With Getter Effect—Comprises Substrate Having Polycrystalline Silicone Layer and Silicon Nitride Layer".
Ghandhi *VLSI Fabrication Principles*, John Wiley & Sons, New York 1983 pp. 168, 167, 234, 235.

*Primary Examiner*—Robert Kunemund
*Attorney, Agent, or Firm*—Collard & Roe, P.C.

[57] ABSTRACT

A process for the production of an epitaxially coated semiconductor wafer, composed of a substrate wafer of monocrystalline silicon having a front side and a rear side, has at least one layer of semiconductor material which is epitaxially deposited on the front side of the substrate wafer and which is obtained by production of a heavily doped silicon monocrystal by crucible-free zone pulling, production of a substrate wafer having polished front side from the monocrystal and deposition of at least one epitaxial layer of semiconductor material on the front side of the substrate wafer.

8 Claims, No Drawings

PROCESS FOR THE PRODUCTION OF AN EPITAXIALLY COATED SEMICONDUCTOR WAFER

BACKGROUND OF THE INVENTION

1. Field of the Invention

The present invention relates to a process for the production of an epitaxially coated semiconductor wafer, composed of a substrate wafer of monocrystalline silicon having a front side and a rear side and at least one layer of semiconductor material which is epitaxially deposited on the front side of the substrate wafer. The invention also relates to a semiconductor wafer which can be obtained by the process.

2. The Prior Art

Epitaxially coated semiconductor wafers and their production are described, for example, in DE-4,119,531 A1. The production comprises the deposition of epitaxial layers on substrate wafers which were cut from a monocrystalline ingot which was pulled by the so-called Czochralski process from a melt contained in a quartz crucible. These monocrystals and the substrate wafers obtained therefrom, which are hereinafter termed CZ monocrystals and CZ substrate wafers, respectively, are contaminated with oxygen originating from the crucible material. The contamination with oxygen is utilized by generating oxygen precipitates by thermal treatment of the substrate wafers, which oxygen precipitates act as so-called internal getters and, in particular, bind metallic impurities to themselves. In this way, the layer epitaxially deposited on the substrate wafer can be kept substantially free of metallic impurities. This is particularly important since electronic structures and components whose serviceability is considerably disturbed by extraneous metal atoms are provided in this region of the semiconductor wafer.

The production of heavily doped CZ monocrystals having low resistivity is, however, very expensive and, in particular, it also presents technical problems in the case of doping with phosphorus. In particular, for process reasons, it is not possible to produce a CZ monocrystal which is uniformly heavily doped with phosphorus. Specifically, it is, as a rule, unavoidable that the dopant concentration in the monocrystal decreases axially and the resistivity increases axially. For this reason, some of the CZ substrate wafers produced from the monocrystal cannot be used as heavily doped substrate wafers. This output loss naturally also has a disadvantageous effect on the price which has to be paid for epitaxially coated semiconductor wafers based on heavily doped CZ substrate wafers.

SUMMARY OF THE INVENTION

It is an object of the present invention to provide an epitaxially coated semiconductor wafer based upon a heavily doped substrate wafer which is inexpensive to produce and also has technical advantages over known semiconductor wafers of this generic class.

The above object is achieved according to the invention by a process for the production of semiconductor wafers of the generic class mentioned, which process comprises the following process steps:

a) producing a heavily doped silicon monocrystal by crucible-free zone pulling;

b) producing a substrate wafer having a polished front side from the monocrystal; and c) depositing at least one epitaxial layer of semiconductor material on the polished front side of the substrate wafer.

According to the invention, the substrate wafers are obtained from monocrystals which have been produced by crucible-free zone pulling (floating zone process). Because of this origin, the terms FZ substrate wafers or FZ monocrystals, respectively, are used below. The dopant concentration in heavily doped FZ monocrystals remains virtually constant over the entire ingot length, with the result that the FZ substrate wafers obtained therefrom are not substantially different in relation to their resistivity. In addition, the FZ process also makes possible, in particular, the production of monocrystals heavily doped with phosphorus and having a dopant concentration which is not achievable in the case of CZ monocrystals under normal production conditions.

The epitaxially coated FZ substrate wafers produced by the process are particularly suitable as base material for the production of integrated electronic components for so-called power MOS applications, for example for the production of power switches, high-reverse-voltage diodes and Schottky diodes since the number of such electronic components which can be integrated per unit area on the semiconductor wafer depends critically on the resistance of the substrate wafer. The higher the dopant concentration in the substrate wafer is, the smaller, for example, is the area needed for a power switch on the semiconductor wafer. In addition, the semiconductor wafers are also suitable as base material for the production of integrated electronic components for so-called CMOS applications and also for the production of discrete electronic components.

The production of the semiconductor wafers in accordance with the invention first comprises the pulling of a heavily doped silicon monocrystal by the FZ process which is known per se and which is described in greater detail, for example, in a review article by W. Dietze (W. Dietze et al., *Crystals, Growth, Properties and Applications*, Vol. 5, Springer-Verlag 1981, pages 1–42). During the pulling of the monocrystal, it is doped with a dopant of Group III A such as boron or a dopant of Group VA of the Periodic Table of Elements, preferably with phosphorus. It is particularly preferable to prepare a gaseous compound of phosphorus which decomposes on contact with the hot silicon molten zone, in which process phosphorus is absorbed in the molten silicon. The doping conditions are adjusted so that the dopant concentration in the monocrystal is greater than $1.5*10^{18}$ atoms/cm$^3$. For the purpose of the invention, the monocrystal and a substrate wafer cut from it are described as heavily doped if the dopant concentration is above this limit value.

A further embodiment of the invention is based upon introducing oxygen into the crystal lattice as a further impurity during the pulling of the monocrystal. A process suitable for this purpose is described in U.S. Pat. No. 5,089,082. The oxygen concentration in the monocrystal is $1*10^{16}$ to $8*10^{17}$ atoms/cm$^3$, preferably $4*10^{17}$ to $5*10^{17}$ atoms/cm$^3$. Oxygen precipitates which act as internal getters can be generated by additionally incorporating oxygen into the substrate wafers. In addition, the incorporation of oxygen into the crystal lattice reduces the tendency to develop dislocations observed by S. M. Hu in FZ substrate wafers (S. M. Hu, Appl. Phys. Lett. 31 (1977), 53).

The finished FZ monocrystal is divided in a known manner into a multiplicity of substrate wafers, for example with the aid of an annular saw. Before an epitaxial layer is deposited on one side of a substrate wafer, it is subjected to chemical and/or mechanical surface treatments. These surface treatments include the conventional lapping, polishing and etching treatments in this industrial field, which do not have to be dealt with in greater detail. The front side of the substrate wafer, on which it is planned to deposit at least one layer of semiconductor material epitaxially, is given a high-gloss polish. In addition, the rear side of the substrate wafer may optionally be coated with a layer of polycrystalline silicon and/or silicon dioxide of which the first is capable, as a so-called external getter, of picking up, in particular, metallic impurities from the monocrystal. The application of layers which act as external getters to the rear side of semiconductor wafers is also known and is therefore not explained in greater detail.

At least one layer of semiconductor material, preferably of silicon, is epitaxially deposited on the polished front side of the substrate wafer. The deposition of semiconductor layers on substrate wafers is known and is described for example, in DE-4,119,531 A1. The substrate wafer is coated in an epitaxial reactor into which various process gases are introduced in a defined sequence of process steps. The type of reactor used (single-wafer or batch reactor), the type of deposition, doping, carrier and flushing gases used and the deposition protocol, that is to say the treatment time, the process step sequence and temperature and pressure conditions during the treatment and the deposition rates are not essential in connection with the present invention. In principle, one or more layers of semiconductor material of any desired composition can be epitaxially deposited on the substrate wafer. In view of the preferred use of the resultant semiconductor wafers, the following layer properties and deposition parameters are advantageous:

Total layer thickness of the epitaxially deposited layers is from 5 to 200 $\mu$m; dopant concentration in the deposited layers is from $1.0*10^{13}$ atoms/cm$^3$ to $1.0*10^{17}$ atoms/cm$^3$; trichlorosilane, dichlorosilane or silane is a semiconductor source for the deposition; concentration of the semiconductor source in the gas phase is from 0.5% to 5.0% by volume, preferably 4% by volume; phosphorus hydride, arsenic hydride or diborane are dopant gases; hydrogen is a carrier gas and hydrogen chloride is an etching gas for conditioning the substrate wafer prior to the deposition. The deposition temperature is preferably 850° C. to 1170° C. and the deposition pressure is preferably 80 to 760 mmHg, particularly preferably atmospheric pressure. A deposition rate of 0.5 to 5 $\mu$m/min, preferably 1.0 to 1.5 $\mu$m/min has proved beneficial.

A particularly preferred semiconductor wafer is based on an FZ substrate wafer which is doped with phosphorus, on whose front side at least one layer of doped silicon is epitaxially deposited and on whose rear side there is a layer of polycrystalline silicon and/or silicon dioxide.

While several embodiments of the present invention have been shown and described, it is to be understood that many changes and modifications may be made thereunto without departing from the spirit and scope of the invention as defined in the appended claims.

What is claimed is:

1. A process for the production of an epitaxially coated semiconductor wafer, composed of a substrate wafer of monocrystalline silicon having a front side and a rear side, and at least one layer of semiconductor material which is epitaxially deposited on the front side of the substrate wafer, which process comprises the steps of:

a) producing a silicon monocrystal by crucible-free zone pulling which is doped with phosphorous having a concentration greater than $1.5*10^{18}$ atoms/cm$^3$;

b) producing a substrate wafer having a polished front side from the monocrystal; and c) depositing at least one epitaxial layer of semiconductor material on the polished front side of the substrate wafer.

2. The process as claimed in claim 1, wherein the monocrystal is contaminated with oxygen during its production, with the result that the oxygen concentration in the substrate wafer is $1*10^{16}$ to $8*10^{17}$ atoms/cm$^3$.

3. The process as claimed in claim 1, wherein the rear side of the substrate wafer is covered with a layer which acts as external getter.

4. The process as claimed in claim 1, wherein at least one silicon layer is epitaxially deposited on the substrate wafer, which silicon layer is doped with an element selected from the group consisting of Group III A and Group V A of the Periodic Table of Elements.

5. A semiconductor wafer which is produced by a process as claimed in claim 1.

6. In a method for providing a base material for the production of electronic power switches, the improvement which comprises utilizing the semiconductor wafer of claim 5 as said base material.

7. In a method for providing a base material for the production of high-reverse-voltage diodes the improvement which comprises utilizing the semiconductor wafer of claim 5 as said base material.

8. In a method for providing a base material for the production of Schottky diodes, the improvement which comprises utilizing the semiconductor wafer of claim 5 as said base material.

* * * * *